United States Patent
Wu et al.

(10) Patent No.: US 9,263,516 B1
(45) Date of Patent: Feb. 16, 2016

(54) PRODUCT COMPRISED OF FINFET DEVICES WITH SINGLE DIFFUSION BREAK ISOLATION STRUCTURES

(71) Applicant: GLOBALFOUNDRIES Inc., Grand Cayman (KY)

(72) Inventors: Xusheng Wu, Ballston Lake, NY (US); Changyong Xiao, Mechanicville, NY (US); Wanxun He, Mechanicville, NY (US); Hongliang Shen, Ballston Lake, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/823,319

(22) Filed: Aug. 11, 2015

Related U.S. Application Data

(62) Division of application No. 14/457,325, filed on Aug. 12, 2014, now Pat. No. 9,171,752.

(51) Int. Cl.
*H01L 21/84* (2006.01)
*H01L 21/00* (2006.01)
*H01L 29/66* (2006.01)
*H01L 29/06* (2006.01)
*H01L 27/088* (2006.01)

(52) U.S. Cl.
CPC ........ *H01L 29/0646* (2013.01); *H01L 27/0886* (2013.01); *H01L 29/0653* (2013.01)

(58) Field of Classification Search
CPC .......... H01L 21/02104; H01L 21/76224; H01L 21/823431; H01L 27/0886; H01L 29/66545; H01L 29/66795; H01L 29/785
USPC ............ 257/347, 354, 401, E21.19; 438/156, 438/158, 159, 164, 595, 157, 283, 221, 224
See application file for complete search history.

(56) References Cited

U.S. PATENT DOCUMENTS

| | | | |
|---|---|---|---|
| 8,703,557 B1 * | 4/2014 | Cai ......................... | H01L 21/00 257/347 |
| 8,846,491 B1 | 9/2014 | Pham et al. | |
| 2009/0294840 A1 | 12/2009 | Gilgen et al. | |
| 2014/0377922 A1 * | 12/2014 | Fung ............... | H01L 21/823431 438/283 |
| 2015/0162339 A1 | 6/2015 | Divakaruni et al. | |
| 2015/0200258 A1 | 7/2015 | Chen et al. | |

* cited by examiner

*Primary Examiner* — Kimberly Rizkallah
*Assistant Examiner* — Brian Turner
(74) *Attorney, Agent, or Firm* — Amerson Law Firm, PLLC

(57) ABSTRACT

An integrated circuit product is disclosed that includes a plurality of trenches in a semiconducting substrate that define first, second and third fins, wherein the fins are side-by-side, and wherein the second fin is positioned between the first and third fins, a layer of insulating material in the plurality of trenches such that a desired height of the first, second and third fins is positioned above an upper surface of the layer of insulating material, a recess defined in the second fin that at least partially defines a cavity in the layer of insulating material, an SDB isolation structure in the cavity on the recessed portion of the second fin, wherein the SDB isolation structure has an upper surface that is above the upper surface of the layer of insulating material, and a gate structure for a transistor positioned above the SDB isolation structure.

11 Claims, 17 Drawing Sheets

(12)  US 9,263,516 B1

PRODUCT COMPRISED OF FINFET DEVICES WITH SINGLE DIFFUSION BREAK ISOLATION STRUCTURES

BACKGROUND OF THE INVENTION

1. Field of the Invention

Generally, the present disclosure relates to the manufacture of semiconductor devices, and, more specifically, to various examples of an integrated circuit product comprised of Fin-FET devices with single diffusion break isolation structures, and various methods of making such products.

2. Description of the Related Art

FIG. 1A is a perspective view of an illustrative prior art FinFET semiconductor device 10 that is formed above a semiconductor substrate 12 that will be referenced so as to explain, at a very high level, some basic features of a FinFET device. In this example, the FinFET device 10 includes a plurality of trenches 14 that define three illustrative fins 16, a gate structure 18, sidewall spacers 20 and a gate cap layer 22. The fins 16 have a three-dimensional configuration: a height H, a width W and an axial length L. The axial length L of the fins 16 corresponds to the direction of current travel in the device 10 when it is operational. The portions of the fins 16 covered by the gate structure 18 are the channel regions of the FinFET device 10

A shallow trench isolation structure (not shown) is formed in the semiconducting substrate 12 around the FinFET device 10 so as to electrically isolate the FinFET device. Traditionally, isolation structures were always the first structures that were formed when manufacturing semiconductor devices. The isolation structures were formed by etching the trenches for the isolation structures and thereafter filling the trenches with the desired insulating material, e.g., silicon dioxide. Thereafter, the isolation structures were masked and the trenches 14 were etched into the substrate 12 so as to define the fins 16. However, as the dimensions of the fins became smaller, problems arose with manufacturing the isolation structures before the fins were formed. As one example, trying to accurately define very small fins in regions that were separated by relatively large isolation regions was difficult due to the non-uniform spacing between various structures on the substrate. One manufacturing technique that is employed in manufacturing FinFET devices is to initially form the trenches 14 in the substrate 12 to define multiple "fins" that extend across the entire wafer or substrate 12, and thereafter remove some of the fins 16 where isolation structures will be formed. Using this type of manufacturing approach, better accuracy and repeatability may be achieved in forming the fins 16 to very small dimensions due to the more uniform environment in which the etching process that forms the trenches 14 is performed.

The size or "footprint" of the fins 16 that are removed so that an isolation structure can be formed may vary in size, i.e., it may be very large (in a relative sense) or very small. In many applications, a section of several adjacent fins, positioned side-by-side, may be removed to make room for a portion of a relatively large isolation structure. In some product designs, only a portion of one single fin may be removed between two adjacent "active" fins to make room for an isolation structure that is to be formed between the two active fins. That is, considering three fins that are formed side-by-side with a uniform gate pitch for all three, a portion of the middle fin may be removed, thereby cutting the middle fin into two active fins. The amount of the middle fin removed in such a situation corresponds approximately to the gate length of a ""dummy" gate structure that will be formed in and above the area of the removed portion of the middle fin. Such a configuration is sometimes referred to as a Single Diffusion Break (SDB), since the isolation material that will be formed where the portion of the middle fin is removed is the only means of preventing undesirable current flow between the two active fins that abut the SDB isolation structure.

One prior art fin removal process that is typically referred to as "Fins-cut-First," will be described with reference to FIGS. 1B-1J. FIG. 1B depicts the device 10 after several process operations were performed. First, an etching process was performed through a patterned masking layer (not shown) so as to define the trenches 14 in the substrate 12 that define the fins 16. Then, a layer of insulating material 24, such as silicon dioxide, was formed so as to overfill the trenches 14. Thereafter, one or more chemical mechanical polishing (CMP) processes, mixed with one or more wet clean processes, were performed to planarize the upper surface of the insulating material 24 such that the process(es) stops on the top of the fins 16. Performing such operations results in the removal of the patterned hard mask and exposing the upper surface of the fins 16.

FIGS. 1C and 1D depict the device 10 after a patterned mask layer 26, e.g., a patterned photoresist mask, was formed above device 10. The patterned mask layer 26 has a plurality of openings 26A, each of which exposes a portion of the axial length of fins 16 that will be removed, i.e., the dimension 16AL, to form SDB isolation regions. The axial length 16AL of the fins 16 that are removed is normally kept as small as possible so as not to unnecessarily consume valuable plot space on the substrate 12 and it will normally be approximately equal to the gate length of a gate structure that will be formed above the area where the exposed portions of the fins are removed.

FIG. 1E depicts the device 10 after a timed etching process was performed through the patterned etch mask 26 to remove the exposed fins 16 and thereby define cavities 17 in the area formerly occupied by the removed fin portions. Typically, substantially the entire vertical height of the exposed fins is removed.

FIG. 1F depicts the device 10 after several process operations were performed. First, the patterned etch mask 26 was removed. Then, another layer of insulating material 19 was deposited so as to overfill the cavities 17. A CMP process was then performed to remove excess amounts of the insulating material 19 positioned outside of the fin cavities 17. In the drawings, the material 19 is provided with a different shading just to make clear that it is formed at a different point in time than the insulating material 24. In practice, the materials 24 and 19 are typically made of the same material, e.g., silicon dioxide.

FIG. 1G depicts the device 10 after a so-called "fin-reveal" etch-back process was performed to recess the layers of insulating material 19, 24 between the fins 16 and thereby expose the upper portions of the fins 16, which corresponds to the final fin height of the fins 16.

An alternative method to achieve the prior art device 10 depicted in FIG. 1G is to apply a two-times lithography technique on the etch mask 26 that, when combined with a corresponding etch process, opens the trench area and SDB isolation regions in the etch mask, respectively. Then, an etching process may be performed to form the shallow trenches and the SDB open areas between fins in the substrate 12. After overfilling the trenches 14 in FIG. 1A and the SDB open areas 17 in FIG. 1E with insulating material, such as silicon dioxide, one or more CMP processes, or wet clean processes, may be performed to remove the silicon dioxide above the mask layer 26, so as to finally obtain the substantially planar surface depicted in FIG. 1F. As shown, the top surface of the fin 16 is exposed such that it is approximately level with the upper surface of the insulating layer 24. Ultimately, the device 10 depicted in FIG. 1G may be obtained by performing a so called "fin-reveal" recess etch-back process, where the SDB isolation structures 19 and the insulating material 24 were recessed to approximately the same height level.

FIGS. 1H-1J depict the device after an illustrative dummy gate structure 30 was formed above the fins 16. In general, the gate structure 30 is comprised of a gate insulation layer 30A and a gate electrode 30B. The gate structure 30 may be made using either so-called gate-first manufacturing techniques or so-called replacement gate manufacturing techniques. Also depicted are an illustrative gate cap layer 32 and sidewall spacers 34. The dashed-circled regions 25 in FIG. 1H depict the locations where the portion of the fins was removed. As depicted for the middle region 25, the removal of the portion of the fin separates the fin 16 into a first active fin 16X and a second active fin 16Y. The dummy gate structure 30 is a "dummy" relative to the active fins 16X, 16Y in the sense that it is not the gate structure that controls the operation of either of the fins 16X, 16Y. The gate structures that control the operation of the devices that include the fins 16X, 16Y are not depicted in FIG. 1H. However, the gate structure 30 may be an operational gate structure for the fins 16 that have remaining portions positioned under the gate structure 30, as depicted by the dashed lines. FIG. 1J is a cross-sectional view that is taken through the long-axis of the fins 16X, 16Y. As depicted, given the relatively short height of the isolation region 19, due to it being formed after the fin cut process was performed and commonly recessed along with the layer of insulating material 24, there is a relatively short path 36 where undesirable diffusion may occur between the fins 16X and 16Y during operations.

One prior art technique that has been employed in an attempt to increase the height of the isolation material under the dummy gate structure 30 between the fins 16X, 16Y is simplistically depicted in FIG. 1K. As shown therein, this prior art method involved forming additional insulating material 40 in the area where the dummy gate structure 30 will be formed. However, this prior art method involved the use of a separate masking layer that permitted formation of the additional isolation material 40 selectively only in regions where such SDB situations were present. As is well known in the art, each additional masking layer that is required when forming an integrated circuit product results in increased manufacturing costs and time, both of which are undesirable.

The present disclosure is directed to various examples of an integrated circuit product comprised of FinFET devices with single diffusion break isolation structures, and various methods of making such products, that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various examples of an integrated circuit product comprised of FinFET devices with single diffusion break isolation structures.

One illustrative integrated circuit product disclosed herein includes, among other things, a plurality of trenches in a semiconducting substrate that define first, second and third fins in the substrate, wherein the first, second and third fins are positioned side-by-side, and wherein the second fin is positioned between the first and third fins, a layer of insulating material positioned in the plurality of trenches such that a desired height of the first, second and third fins is positioned above an upper surface of the layer of insulating material, a recess defined in the second fin structure that at least partially defines a cavity in the layer of insulating material above the recess in the second fin, an SDB isolation structure positioned in the cavity on the recessed portion of the second fin, wherein the SDB isolation structure has an upper surface that is positioned at a level that is above a level of the upper surface of the layer of insulating material, and a gate structure for a transistor positioned above the SDB isolation structure.

Another illustrative integrated circuit product disclosed herein includes, among other things, a plurality of trenches in a semiconducting substrate that define first, second and third fins in the substrate, wherein the first, second and third fins are positioned side-by-side, and wherein the second fin is positioned between the first and third fins, a layer of silicon dioxide positioned in the plurality of trenches such that a desired height of the first, second and third fins is positioned above an upper surface of the layer of silicon dioxide, a recess defined in the second fin structure that at least partially defines a cavity in the layer of silicon dioxide, an SDB silicon dioxide isolation structure positioned in the cavity on the recessed portion of the second fin, wherein the SDB silicon dioxide isolation structure has an upper surface that is positioned at a level that is above a level of the upper surface of the layer of silicon dioxide and wherein the upper surface of the SDB silicon dioxide isolation structure is approximately level with an upper surface of the second fin positioned on opposite sides of the SDB silicon dioxide isolation structure, and a gate structure for a transistor positioned above the SDB silicon dioxide isolation structure.

Yet another illustrative integrated circuit product disclosed herein includes, among other things, a plurality of trenches in a semiconducting substrate that define first, second and third fins in the substrate, wherein the first, second and third fins are positioned side-by-side, and wherein the second fin is positioned between the first and third fins, a layer of insulating material positioned in the plurality of trenches such that a desired height of the first, second and third fins is positioned above an upper surface of the layer of insulating material, a recess defined in the second fin structure that at least partially defines a cavity in the layer of insulating material, an SDB isolation structure positioned in the cavity on the recessed portion of the second fin, wherein the SDB isolation structure has an upper surface that is positioned at a level that is above a level of the upper surface of the layer of insulating material, the upper surface of the SDB isolation structure is approximately level with an upper surface of the second fin positioned on opposite sides of the SDB isolation structure, and a portion of the SDB isolation structure positioned above the upper surface of the recessed layer of insulating material has a substantially uniform width in a direction that corresponds to a width of the second fin, and a gate structure for a transistor positioned above the SDB isolation structure.

BRIEF DESCRIPTION OF THE DRAWINGS

The disclosure may be understood by reference to the following description taken in conjunction with the accompanying drawings, in which like reference numerals identify like elements, and in which.

Figure 1A:
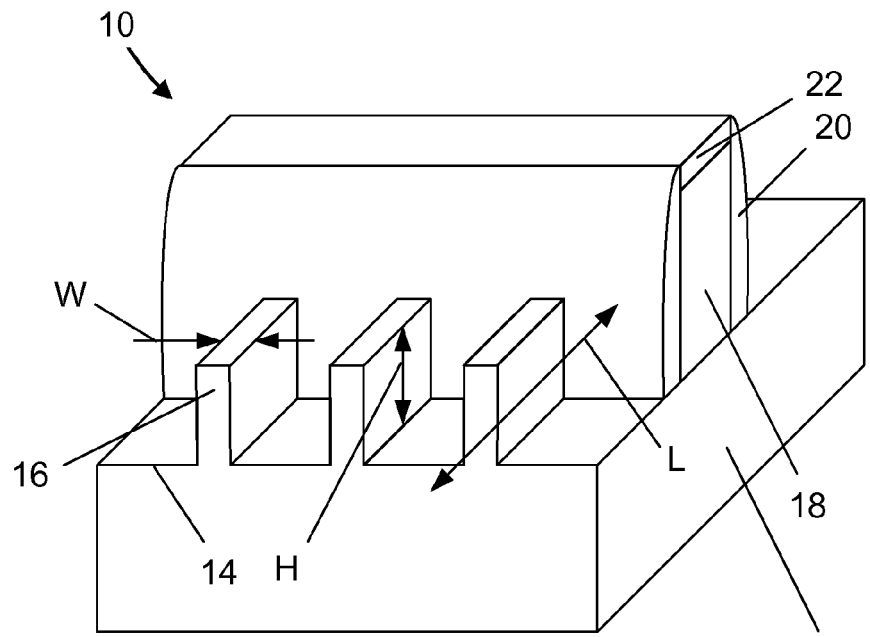
FIG. 1A is a perspective view of one illustrative embodiment of a prior art FinFET device.
Figure 1B:
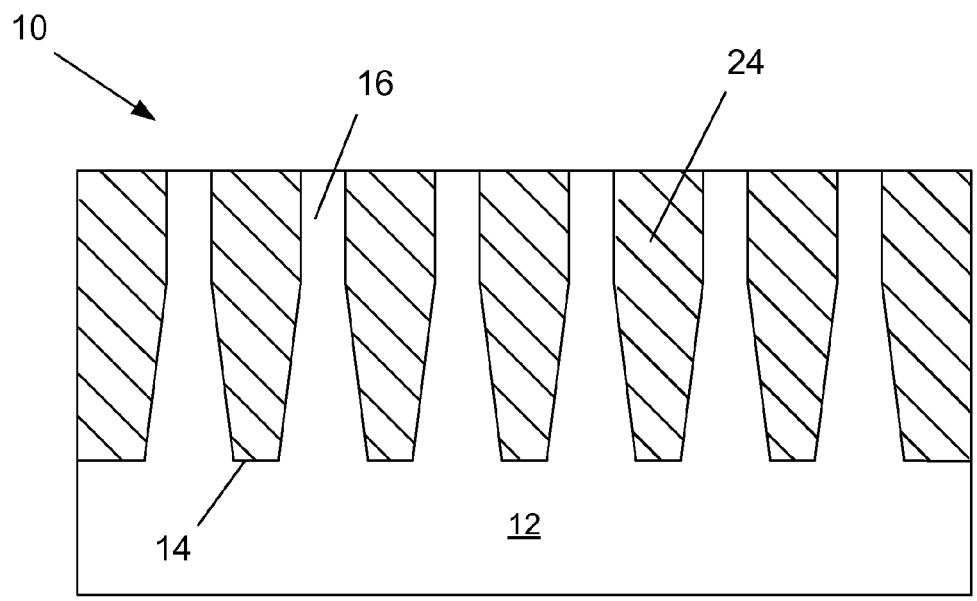
FIGS. 1B-1J depict an illustrative prior art method of removing selected portions of fin structures when forming FinFET semiconductor devices.
Figure 1C:
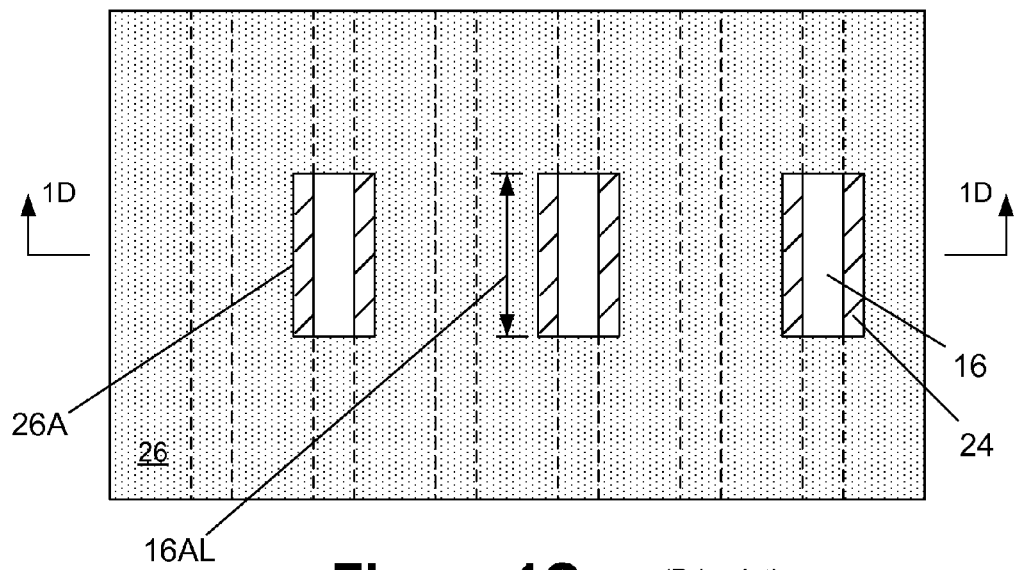
Figure 1D:
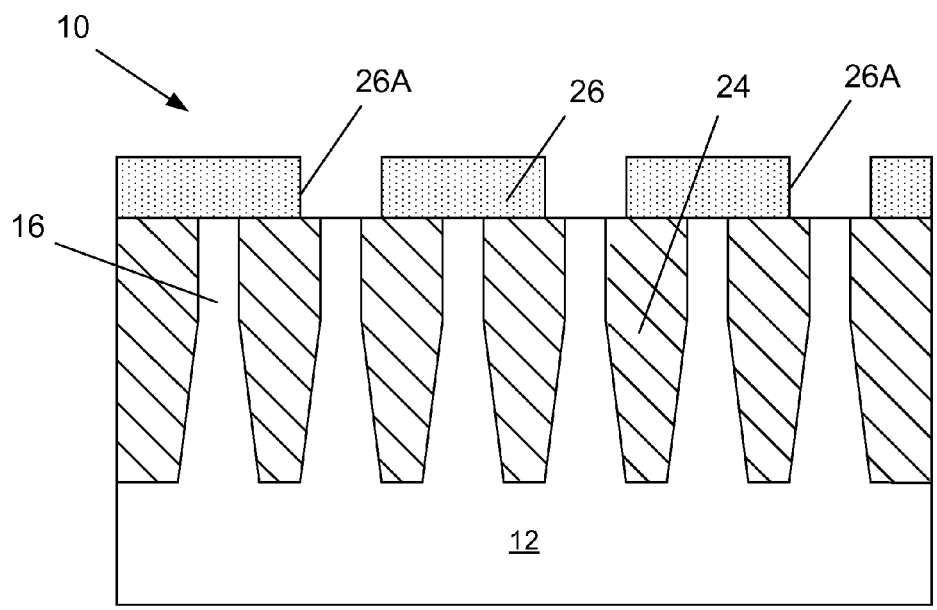
Figure 1E:
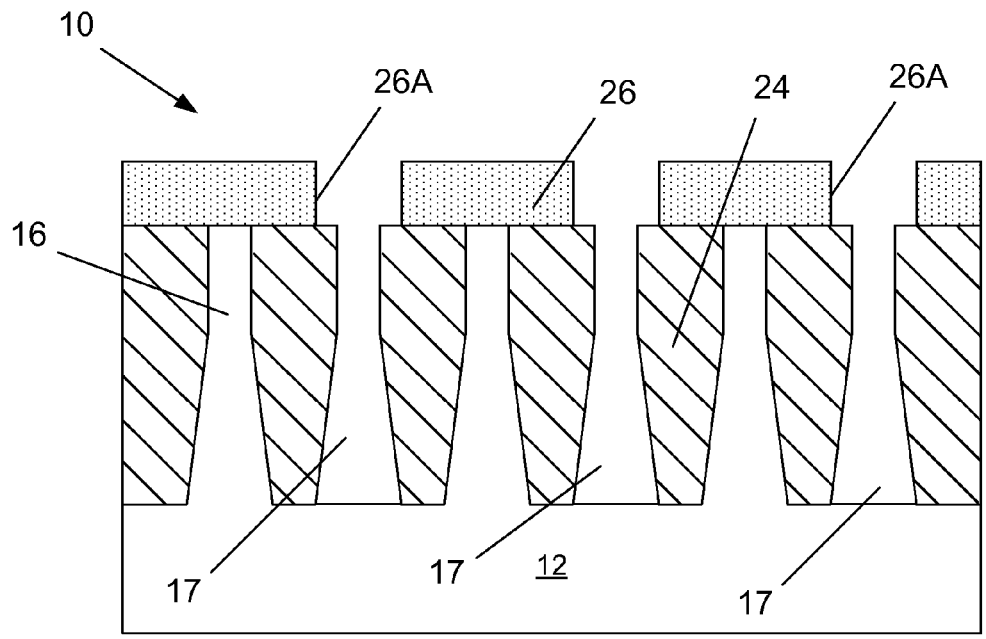
Figure 1F:
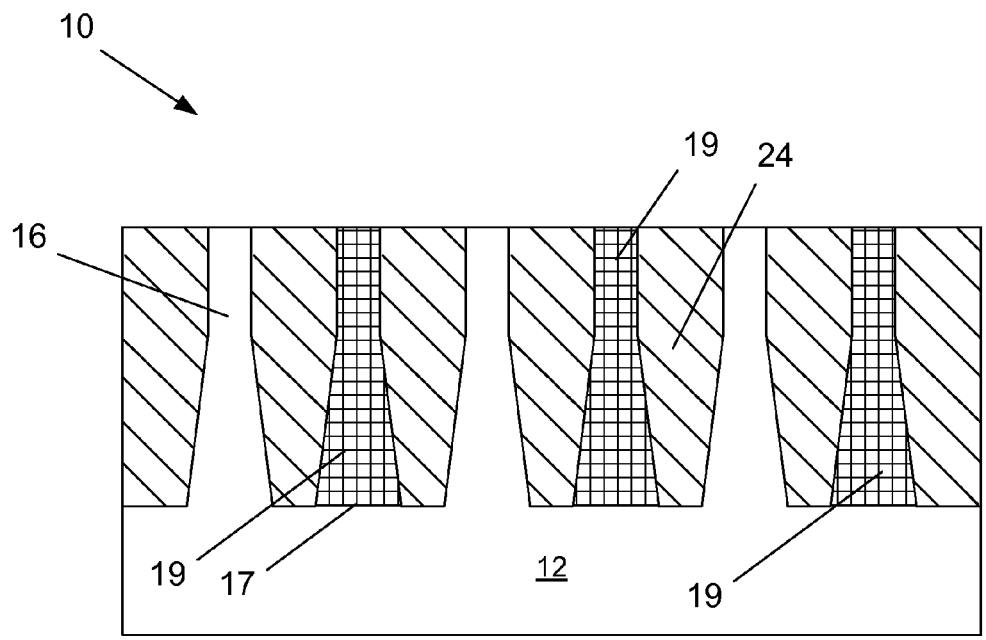
Figure 1G:
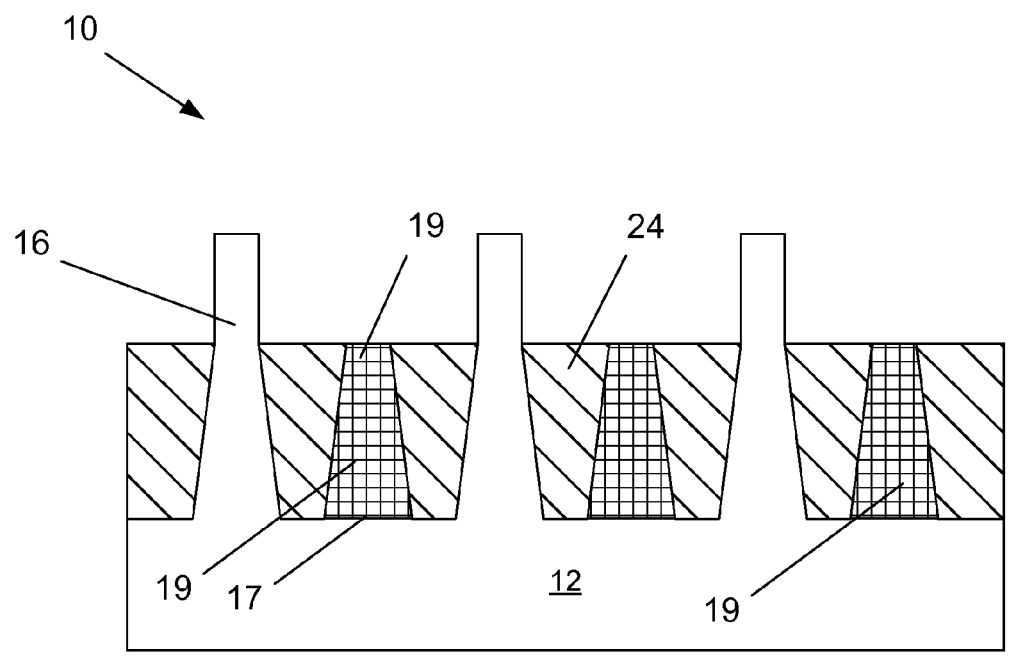
Figure 1H:
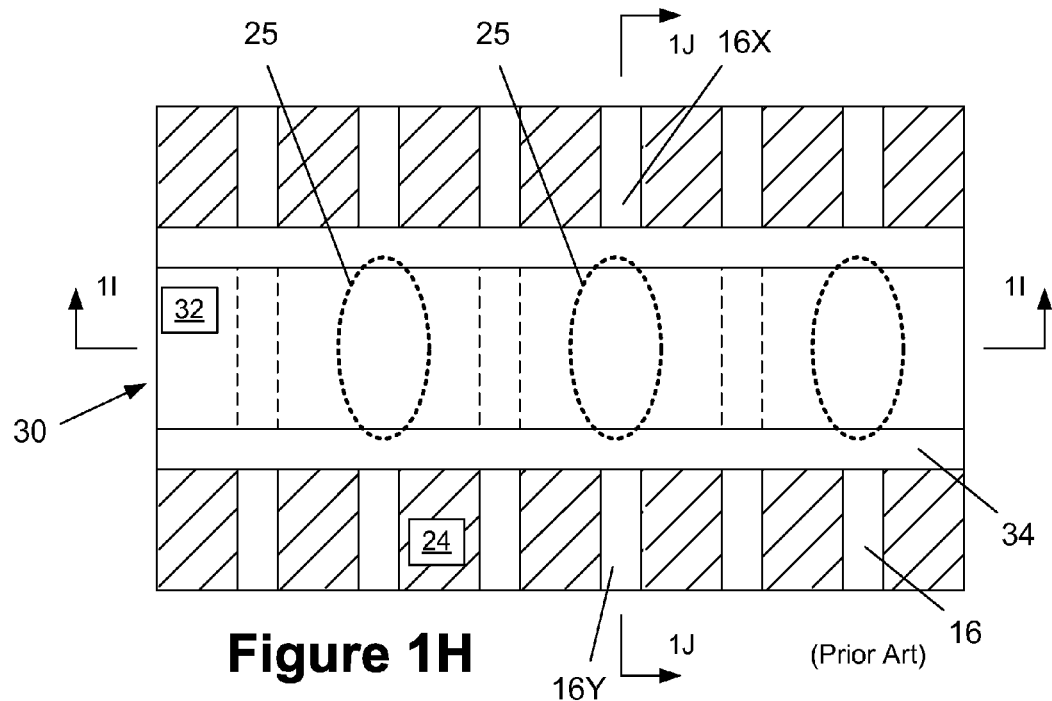
Figure 1I:
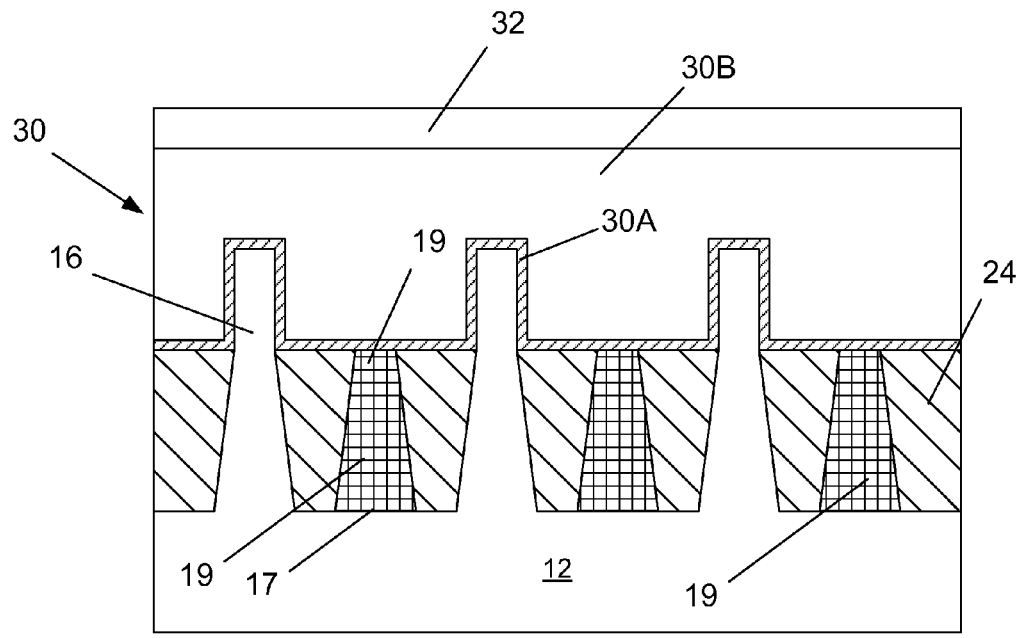
Figure 1J:
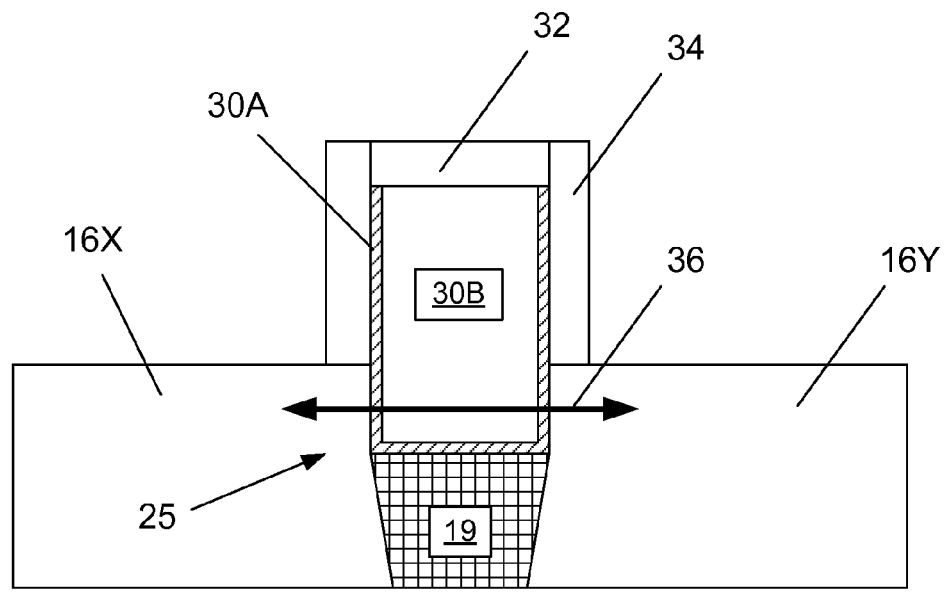
Figure 1K:
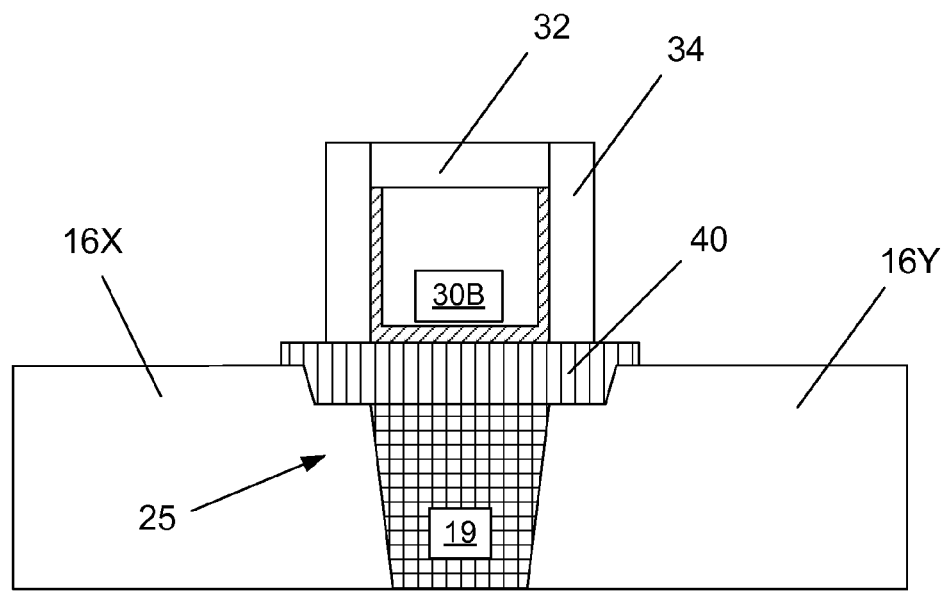
FIG. 1K simplistically depicts one illustrative prior art method of increasing the height of an isolation structure under a dummy gate structure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods for removing selected fins that are formed for FinFET semiconductor devices. As will be readily apparent to those skilled in the art upon a complete reading of the present application, the methods disclosed herein may be employed in manufacturing a variety of different devices, including, but not limited to, logic devices, memory devices, etc. With reference to the attached figures, various illustrative embodiments of the methods and devices disclosed herein will now be described in more detail.

Figure 2A:
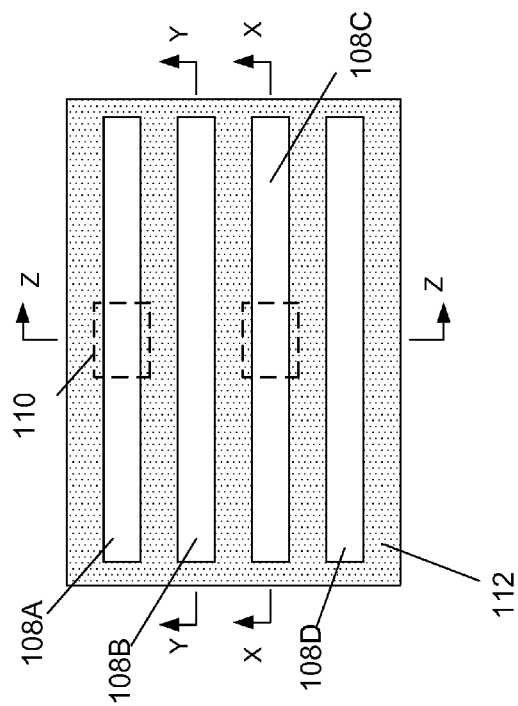
FIGS. 2A-2H depict various illustrative examples of an integrated circuit product comprised of FinFET devices with single diffusion break isolation structures, and various methods of making such products.
Figure 2A:
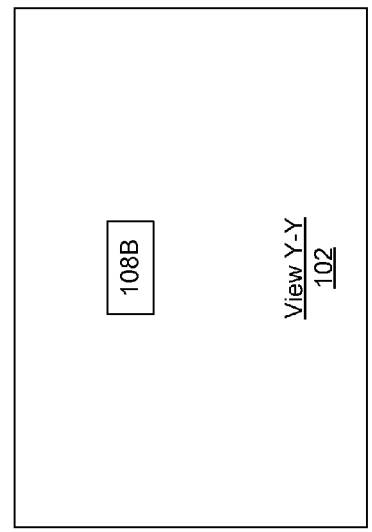
Figure 2A:
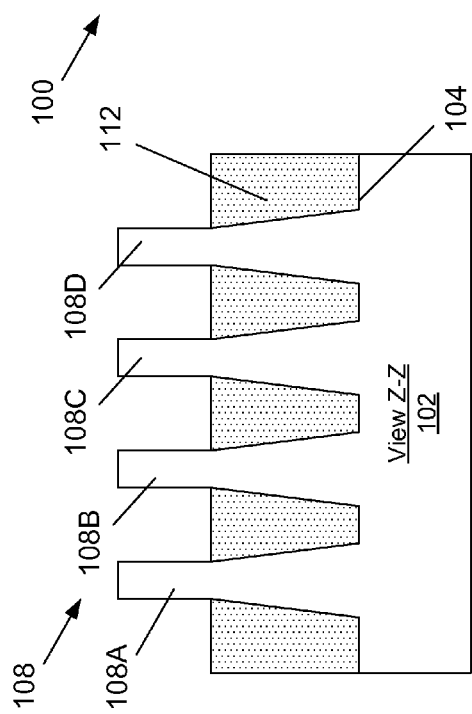
Figure 2A:
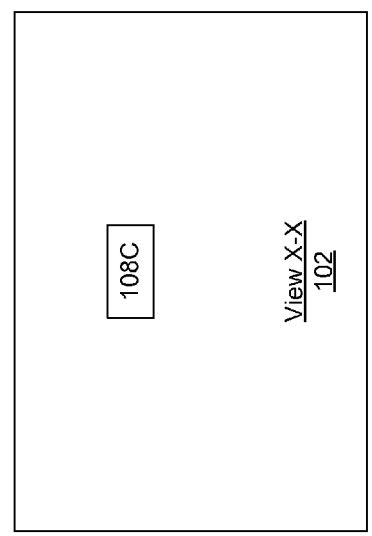

FIGS. 2A-2H depict one illustrative example of an integrated circuit product 100 comprised of FinFET devices with single diffusion break isolation structures, and various methods of making such products. FIG. 2A is a simplified view of a product 100 at an early stage of manufacturing wherein the product 100 is formed in and above a semiconductor substrate 102. As will be recognized by those skilled in the art after a complete reading of the present application, the product 100 described herein may include N-type FinFET devices, P-type FinFET devices or both types of devices (CMOS applications). In this illustrative embodiment, the substrate 102 has a bulk semiconducting material configuration. The substrate 102 may be made of silicon or it may be made of materials other than silicon. Thus, the terms "substrate" or "semiconducting substrate" should be understood to cover all forms of all semiconductor materials. The various components and structures of the product 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application.

FIG. 2A depicts the product 100 at a point in fabrication where a plurality of fins 108 have been formed across a substrate 102. In the example depicted herein, four illustrative fin structures 108A-D are formed for the product 100. In one example, for processing simplicity, the fins 108 are formed in a single pitch pattern, rather than more complex multiple fin pitch arrangements. FIG. 2A contains a simplistic plan drawing of the fins 108 and indicates where various cross-sectional views in the attached drawings are taken, as well as locations 110 where SDB isolation structures will be formed along the fins 108A and 108C using the methods disclosed herein. The view "X-X" is a cross-sectional view that is taken through the long axis of the fin 108C of the product 100 in a direction that corresponds to the current transport direction of the devices 100 when they are completed; the view "Y-Y" is a cross-sectional view that is taken through the long axis of the fin 108B in a direction that corresponds to the current transport direction of the devices; and the view Z-Z is a cross-sectional view taken through all of the fins 108 in a direction that corresponds to the gate width direction of the completed FinFET devices.

FIG. 2A depicts the product 100 after several process operations were performed. First, an etching process was performed through the patterned masking layer (not shown) to define a plurality of fin-formation trenches 104 in the substrate 102. The fin-formation trenches 104 define a plurality of fins 108. Next, a layer of insulating material 112, e.g., silicon dioxide, was deposited so as to overfill the fin-formation trenches 104. Then, a chemical mechanical polishing (CMP) process was performed to planarize the upper surface of the layer of insulating material 112 with the top of the fins 108. Thereafter, a recess etching process was performed to recess the layer of insulating material 112 so as to reveal the final exposed height of the fins 108. The fins 108 may be of any size, i.e., any size or width. In the illustrative example depicted in the attached figures, the fin-formation trenches 104 and the fins 108 are all of a uniform size and shape. However, such uniformity in the size and shape of the fin-formation trenches 104 and the fins 108 is not required to practice the inventions disclosed herein. Thus, the size and configuration of the fin-formation trenches 104, as well as the fins 108, and the manner in which they are made, should not be considered a limitation of the present invention.

Figure 2B:
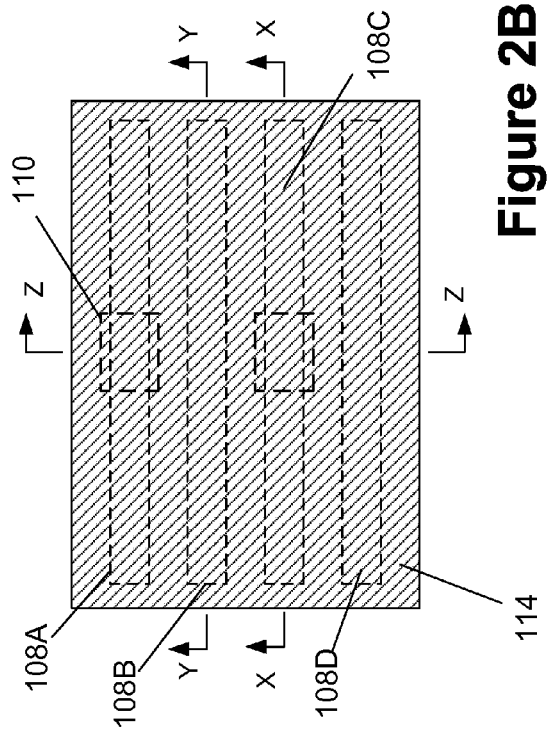
Figure 2B:
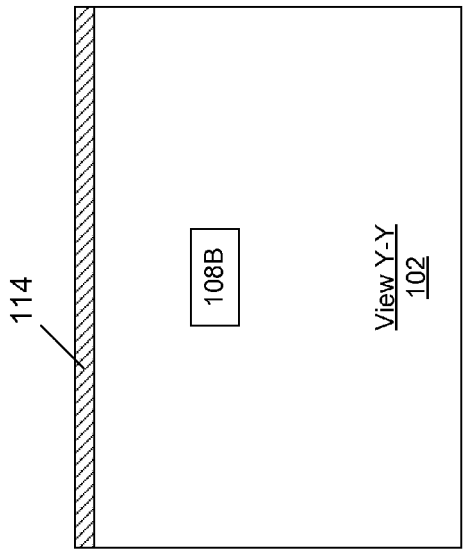
Figure 2B:
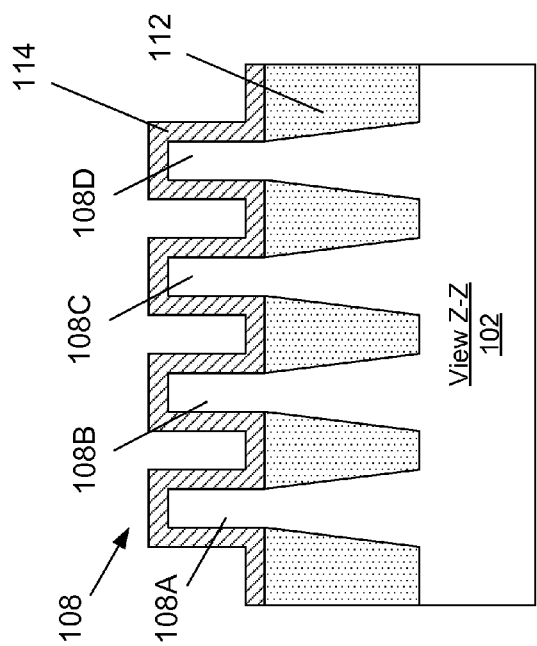
Figure 2B:
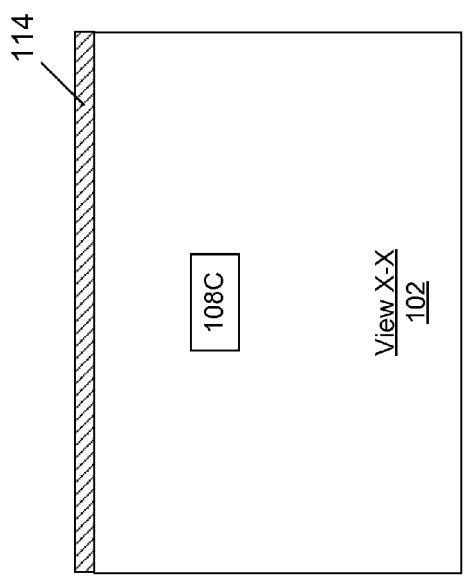

FIG. 2B depicts the product 100 after an etch mask layer 114 is conformably deposited on the fins 108. The etch mask layer 114 may be comprised of a variety of different materials, e.g., silicon nitride, it may be formed to any desired thickness, e.g., 5-20 nm, and it may be formed using a variety of known processes, e.g., ALD, CVD, etc.

Figure 2C:
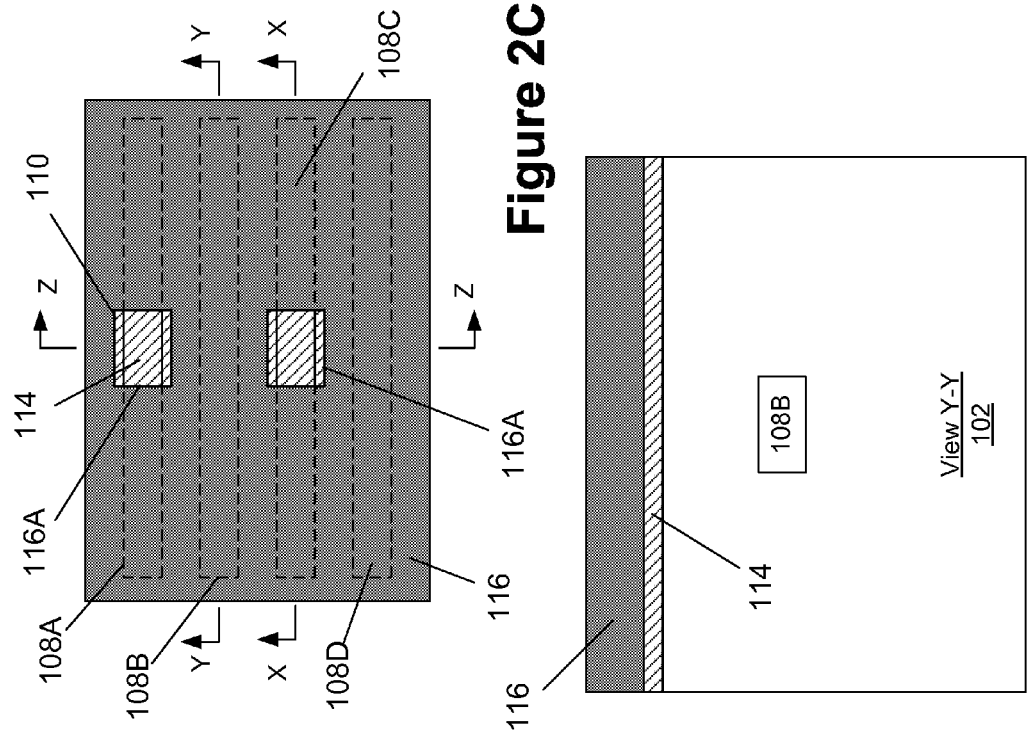
Figure 2C:
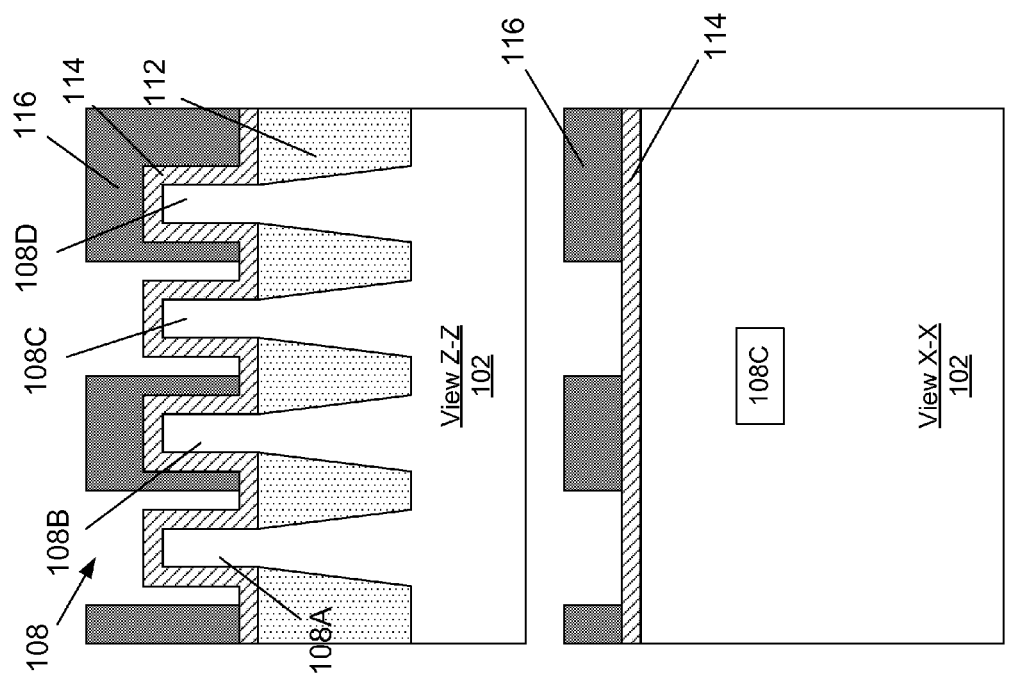

FIG. 2C depicts the product 100 after a patterned masking layer 116, e.g., a patterned photoresist mask, was formed on the product 100 above the etch mask layer 114. The patterned masking layer 116 contains a plurality of openings 116A that correspond to the locations 110 where the SDB isolation structures will be formed.

Figure 2D:
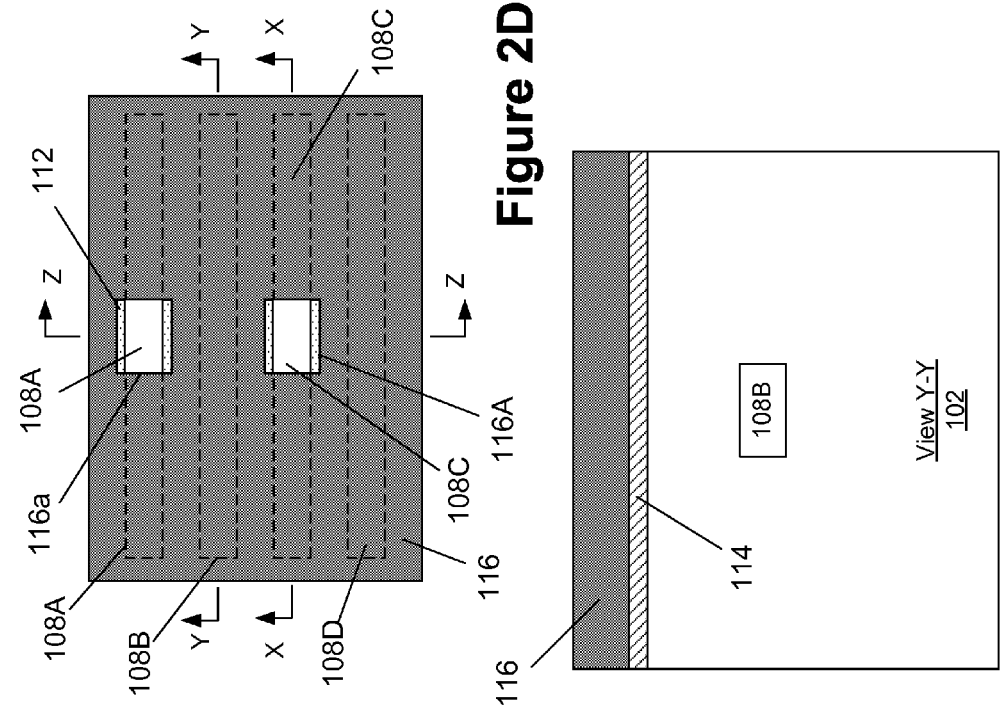
Figure 2D:
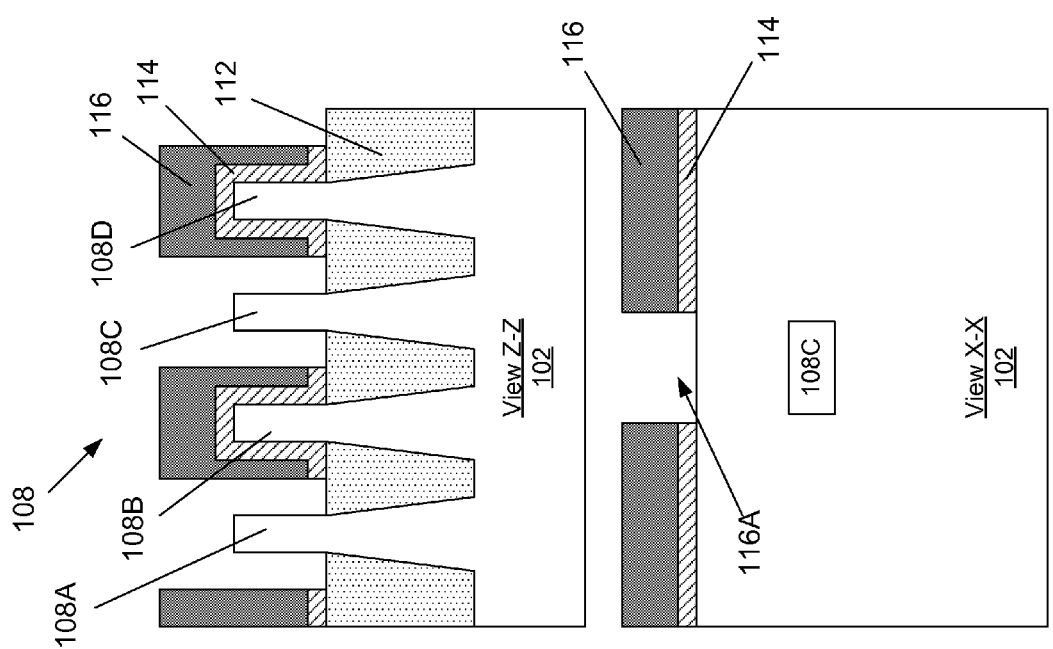

FIG. 2D depicts the product 100 after one or more etching processes were performed through the patterned masking layer 116 to remove the exposed portions of the etch mask layer 114. This process operation exposes the portions of the fins 108A and 108C that are to be removed to make room for the SDB isolation structures.

Figure 2E:
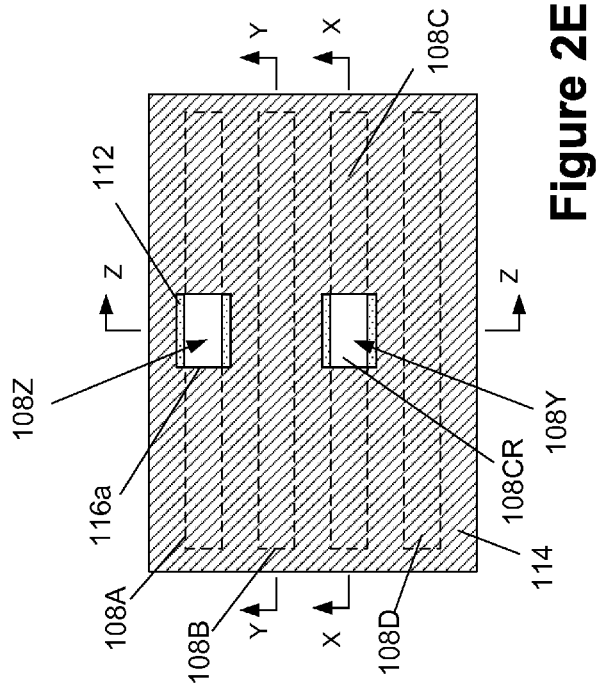
Figure 2E:
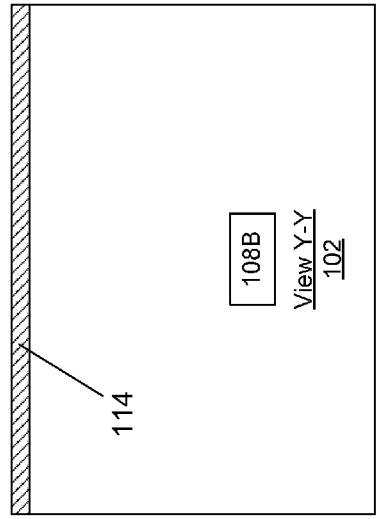
Figure 2E:
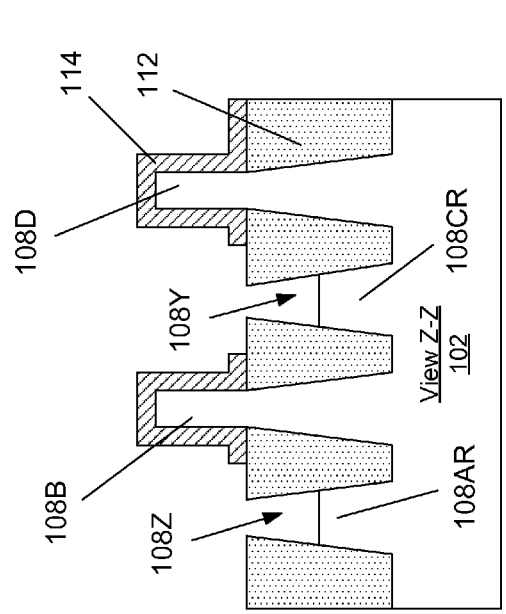
Figure 2E:
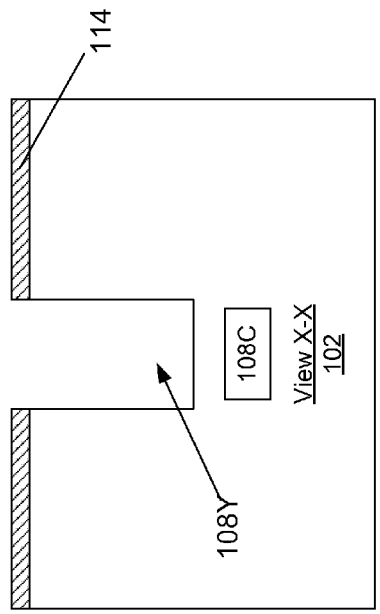

FIG. 2E depicts the product 100 after the patterned masking layer 116 was removed and after an etching process was performed through the now patterned conformal etch mask layer 114 so as to remove the desired portions of the fins 108A and 108C. The etching process results in the formation of recessed fin structures 108AR and 108CR and the formation of cavities 108Z and 108Y, respectively, above the recessed fin structures and within the recessed layer of insulating material 112. The amount or recessing of the fins 108A, 108C may vary depending upon the particular application. In some cases, substantially all of the vertical height of the exposed portion of the fins 108A, 108C may be removed, i.e., the fins may be removed down to the bottom of the trenches 104. In one embodiment, the depth of the cavities 108Y, 108Z may be about 20-90 nm relative to the upper surface of the recessed layer of insulating material 112. Note that, using the process flow described herein, the removal of the desired portions of the fins 108A, 108C to make room for the SDB isolation regions is performed after the "fin reveal" etching process that was performed to recess the layer of insulating material 112. Accordingly, unlike traditional prior art processing techniques, the height of the SDB isolations structures formed herein can be set independently of the general "fin-reveal" recess etching process.

Figure 2F:
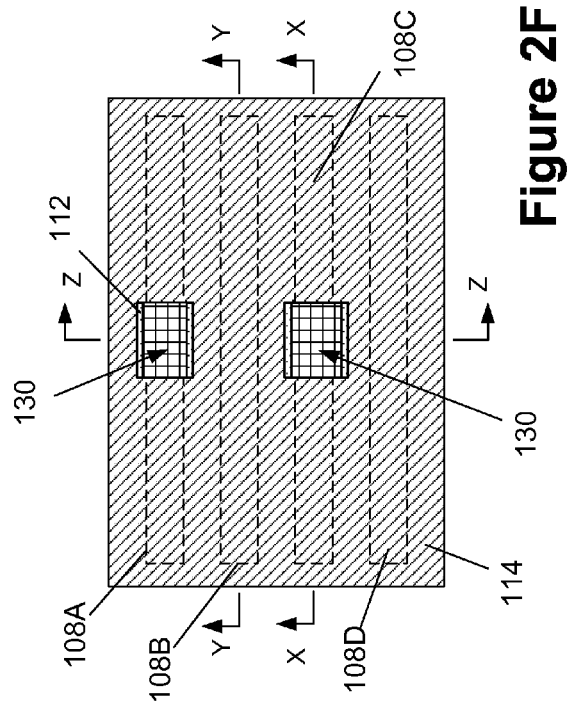
Figure 2F:
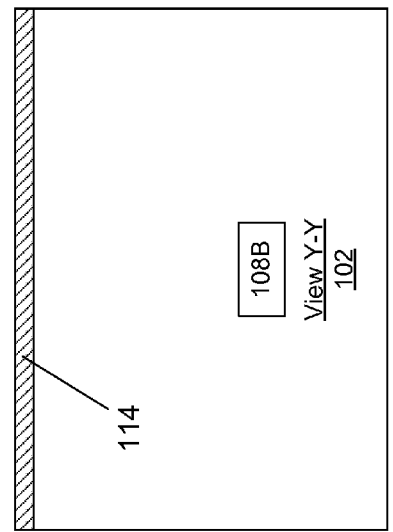
Figure 2F:
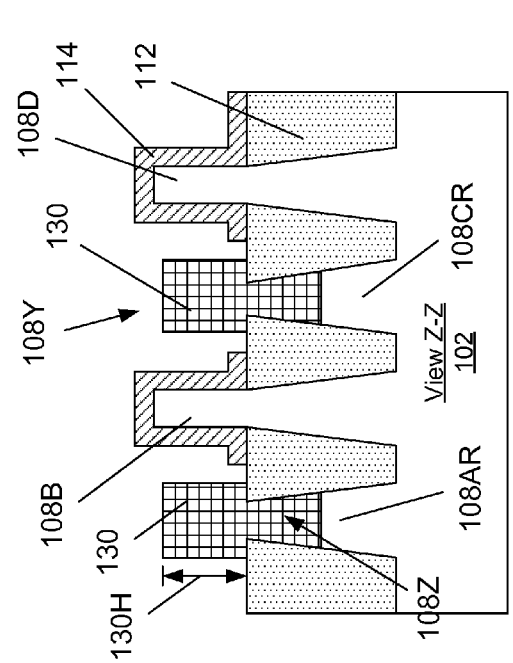
Figure 2F:
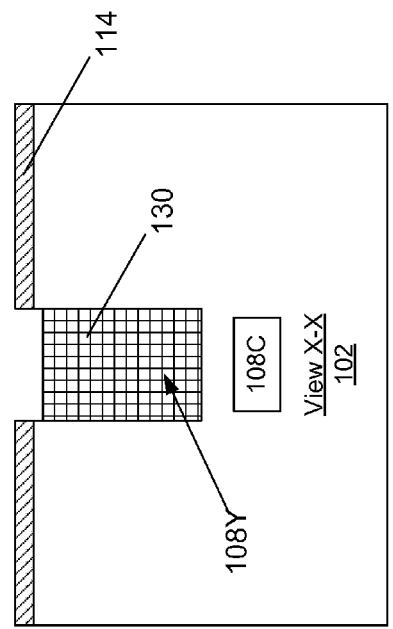

FIG. 2F depicts the product 100 after a thermal oxidation process is performed to grow an SDB isolation structure 130, e.g., silicon dioxide, in the cavities 108Y, 108Z. Note that the patterned masking layer 114 prevents formation of the material of the SDB isolation structure 130 on all of the other surfaces of the fins 108. The overall height of the SDB isolation structure 130 may vary depending upon the particular application. In one embodiment, the height 130H of the SDB isolation structure 130 may be about 20-50 nm relative to the upper surface of the recessed layer of insulating material 112. In some cases, the upper surface of the SDB isolation structure 130 may be approximately level with the upper surface of the fin 108C positioned on opposite sides of the SDB isolation structure 130 (see view X-X). Also note the portion of the SDB isolation structure 130 positioned above the upper surface of the recessed layer of insulating material 112 has a substantially uniform width (view Z-Z) in a direction that corresponds to the width of the fins 108.

Figure 2G:
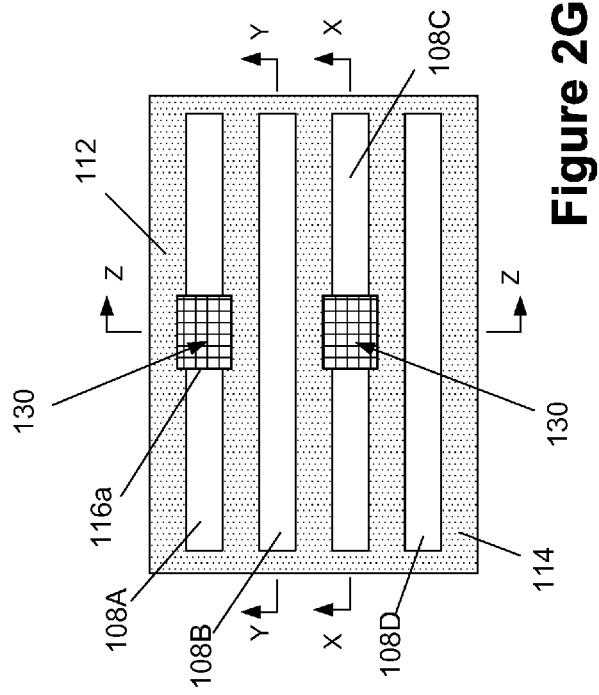
Figure 2G:
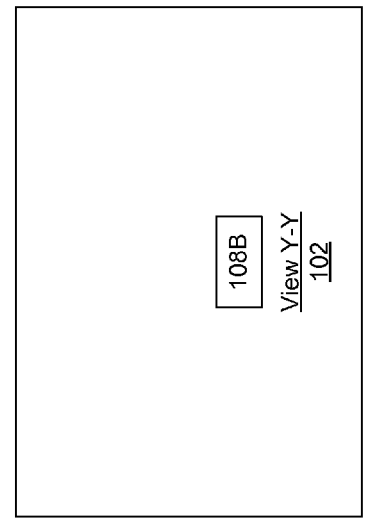
Figure 2G:
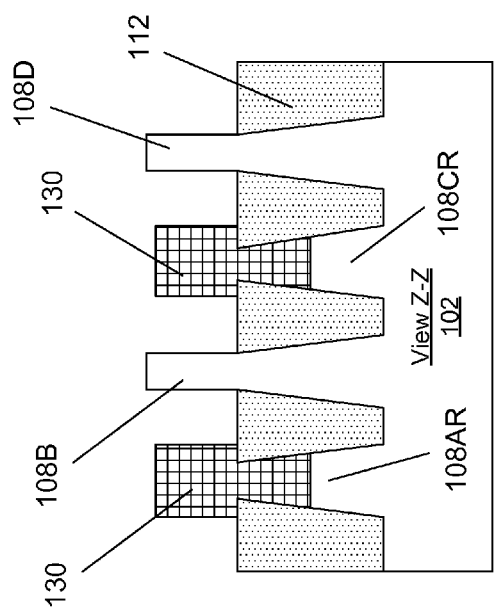
Figure 2G:
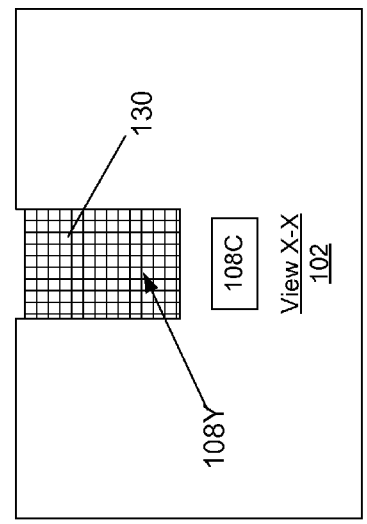

FIG. 2G depicts the product 100 after the patterned etch mask layer 114 was removed.

Figure 2H:
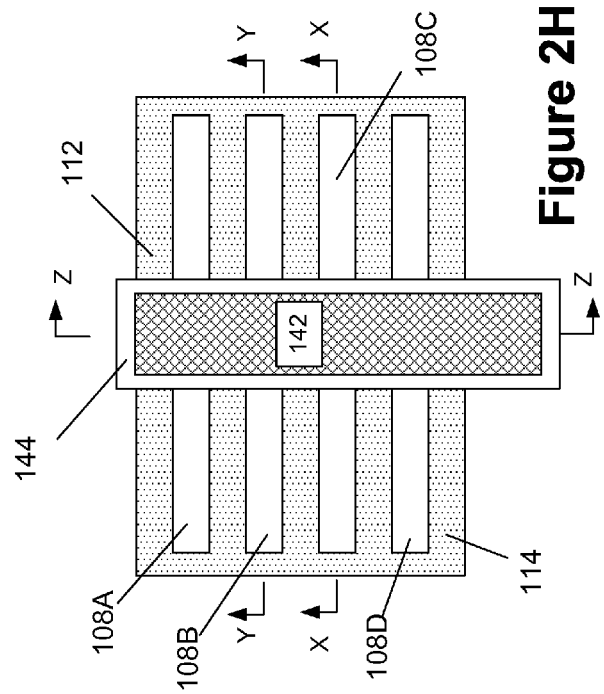
Figure 2H:
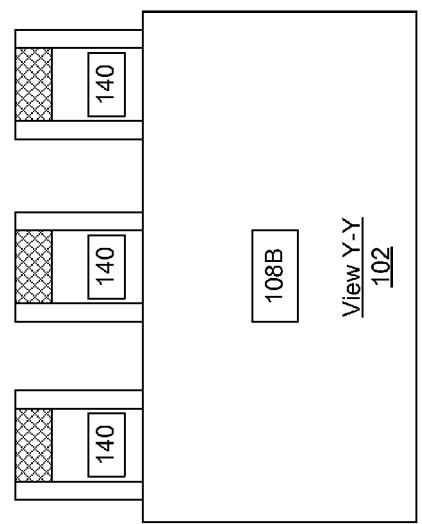
Figure 2H:
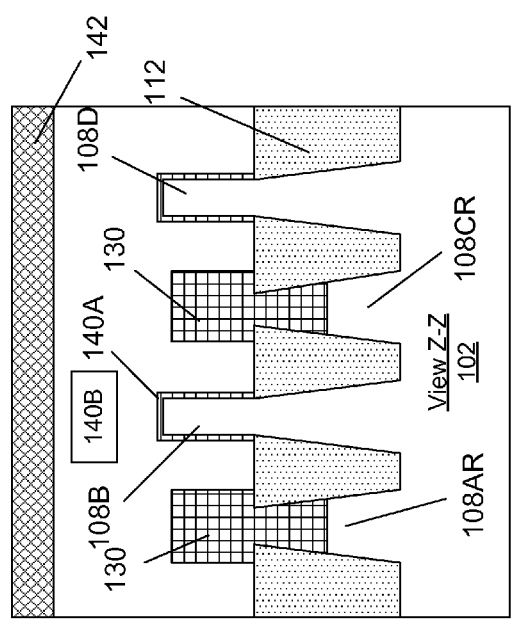
Figure 2H:
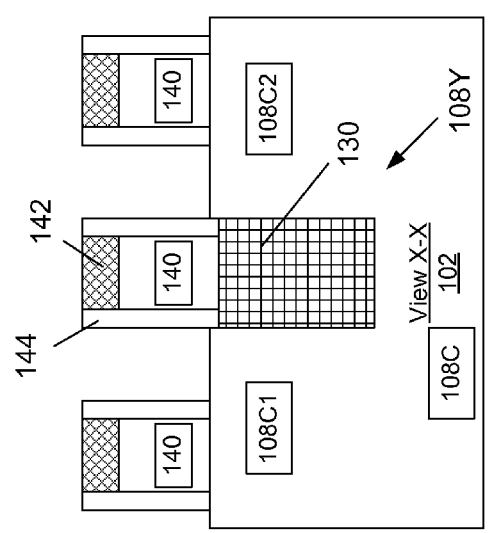

FIG. 2H depicts the product 100 after an illustrative and schematically depicted gate structure 140 is formed across the fins 108 and above the SDB isolation structure 130. Other gate structures 140 are formed across the fins 108 at this time as well, as depicted in the X-X and Y-Y views. The gate structure 140 positioned above the SDB isolation structure 130 is a "dummy" gate structure relative to the portions of the fins 108C1, 108C2 (see view X-X) on opposite sides of the SDB isolation structure 130. Given the increased height of the SDB isolation structure 130 relative to the relatively short height of the SDB isolation structures formed using prior art techniques, there is much less chance of undesirable leakage occurring between the fins 108C1 and 108C2. Moreover, the relatively tall SDB isolation structures 130 disclosed herein may be formed without the need of using an additional masking layer, thereby avoiding the cost and time associated with the use of such an additional masking layer. The gate structure 140 depicted herein is intended to be representative in nature of any type of gate structure that may be employed in manufacturing integrated circuit products. As one specific example, the gate structure 140 may include a gate insulation layer 140A and a gate electrode structure 140B. The gate insulation layer 140A may be made of silicon dioxide or a high-k (k value greater than 10) insulation layer or a hybrid gate insulation structure comprised of both a silicon dioxide layer and a high-k insulation layer. The gate electrode structure 140B may be made of a conductive material, such as polysilicon or one or more layers of metal. Also depicted is a gate cap layer 142 (e.g., silicon nitride) and a sidewall spacer 144 (e.g., silicon nitride) formed adjacent the gate structure 140. The gate structure 140 may be formed using so-called gate-first or replacement gate manufacturing techniques. At the point of fabrication depicted in FIG. 2H, the product may be completed by performing traditional manufacturing operations, e.g., formation of source/drain contacts, formation of metallization layers, etc.

Figure 3A:
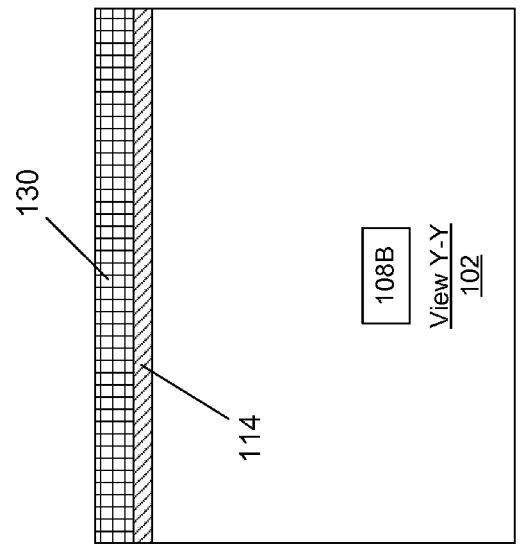
FIGS. 3A-3C depict yet other illustrative examples of an integrated circuit product comprised of FinFET devices with single diffusion break isolation structures, and various methods of making such products.
Figure 3A:
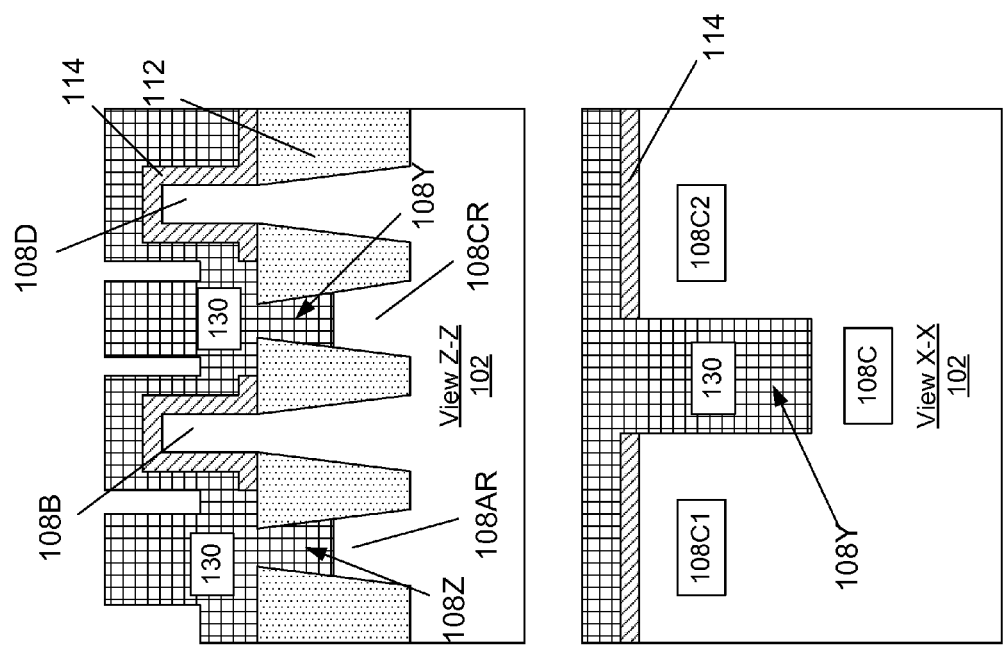
Figure 3B:
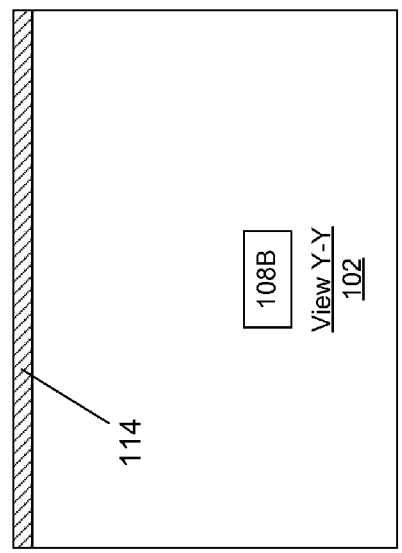
Figure 3B:
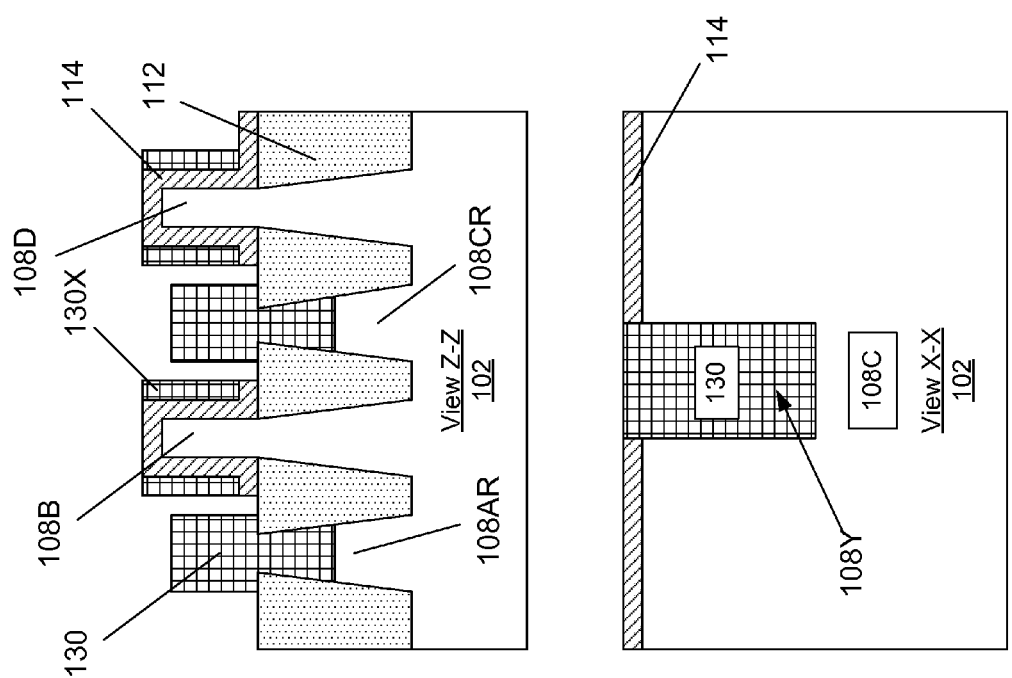
Figure 3C:
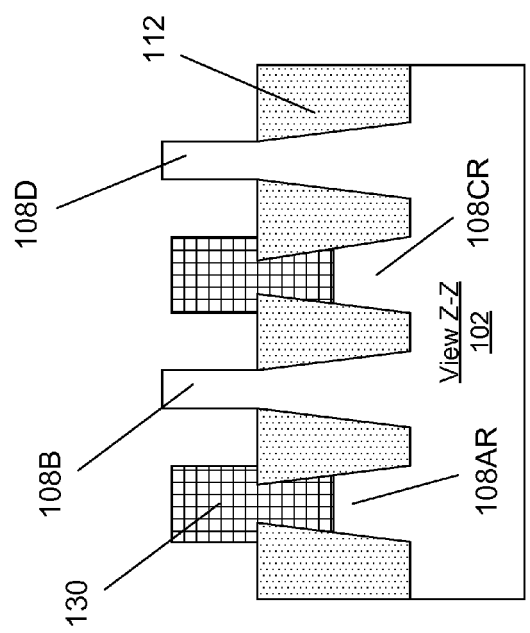
Figure 3C:
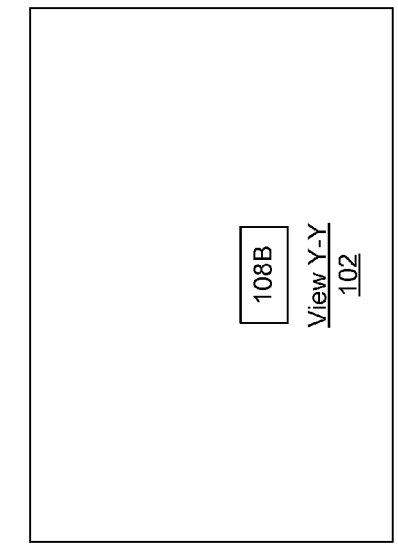
Figure 3C:
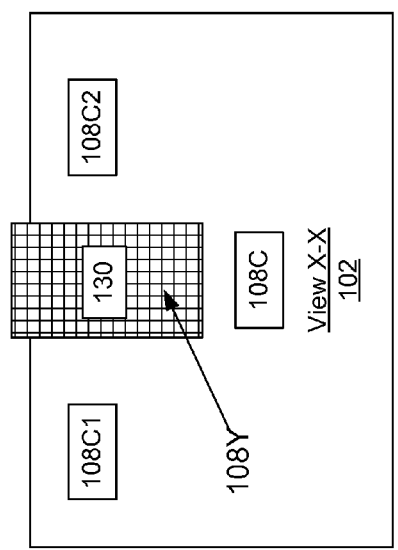

FIGS. 3A-3C depict yet other illustrative examples of an integrated circuit product comprised of FinFET devices with single diffusion break isolation structures, and various methods of making such products. Relative to the embodiment discussed above, in this embodiment, the material for the SDB isolation structure 130 is formed by performing a deposition process rather than a thermal growth process.

Accordingly, FIG. 3A depicts the product at a point in fabrication that corresponds to that shown in FIG. 2E, except that, in this embodiment, the material for the SDB isolation structure 130 is deposited across the product 100 so as to overfill the cavities 108Y, 108Z. A conformal ALD oxide deposition process may be performed so as to achieve the profile of the deposited isolation material depicted in view Z-Z.

FIG. 3B depicts the product 100 after an anisotropic etching process was performed on the material of the SDB isolation structure 130. This etching process results in the definition of the SDB isolation structures 130, clears the material from above the upper surface of the patterned etch mask 114, and results in the formation of sidewall spacers 130X on the patterned etch mask 114 adjacent the sidewalls of the fins 108.

FIG. 3C depicts the product after a wet etching process is performed to remove the patterned etch mask 114, which effectively "lifts off" the sidewall spacers 130X when the patterned etch mask 114 is removed. At this point in the process flow, the gate structure 140 may be formed above the product 100 as described above.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. An integrated circuit product, comprising:
a plurality of trenches in a semiconducting substrate that define first, second and third fins in said substrate, wherein said first, second and third fins are positioned side-by-side, and wherein said second fin is positioned between said first and third fins;
a layer of insulating material positioned in said plurality of trenches such that a desired height of said first, second and third fins is positioned above an upper surface of said layer of insulating material;
a recess defined in said second fin structure that at least partially defines a cavity in said layer of insulating material;
an SDB isolation structure positioned in said cavity on said recessed portion of said second fin, wherein said SDB isolation structure has an upper surface that is positioned at a level that is above a level of said upper surface of said layer of insulating material; and
a gate structure for a transistor positioned above said SDB isolation structure.

2. The product of claim 1, wherein said SDB isolation structure and said layer of insulating material are both made of silicon dioxide.

3. The product of claim 1, wherein said upper surface of said SDB isolation structure is approximately level with an upper surface of said second fin positioned on opposite sides of said SDB isolation structure.

4. The product of claim 1, wherein a portion of said SDB isolation structure positioned above said upper surface of said recessed layer of insulating material has a substantially uniform width in a direction that corresponds to a width of said second fin.

5. The product of claim 1, wherein said first, second and third fins are arranged on a single fin pitch pattern.

6. An integrated circuit product, comprising:
a plurality of trenches in a semiconducting substrate that define first, second and third fins in said substrate, wherein said first, second and third fins are positioned side-by-side, and wherein said second fin is positioned between said first and third fins;
a layer of silicon dioxide positioned in said plurality of trenches such that a desired height of said first, second and third fins is positioned above an upper surface of said layer of silicon dioxide;
a recess defined in said second fin structure that at least partially defines a cavity in said layer of silicon dioxide;
an SDB silicon dioxide isolation structure positioned in said cavity on said recessed portion of said second fin, wherein said SDB silicon dioxide isolation structure has an upper surface that is positioned at a level that is above a level of said upper surface of said layer of silicon dioxide and wherein said upper surface of said SDB silicon dioxide isolation structure is approximately level with an upper surface of said second fin positioned on opposite sides of said SDB silicon dioxide isolation structure; and
a gate structure for a transistor positioned above said SDB silicon dioxide isolation structure.

7. The product of claim 6, wherein a portion of said SDB silicon dioxide isolation structure positioned above said upper surface of said recessed layer of insulating material has a substantially uniform width in a direction that corresponds to a width of said second fin.

8. The product of claim 7, wherein said first, second and third fins are arranged on a single fin pitch pattern.

9. An integrated circuit product, comprising:
a plurality of trenches in a semiconducting substrate that define first, second and third fins in said substrate, wherein said first, second and third fins are positioned side-by-side, and wherein said second fin is positioned between said first and third fins;
a layer of insulating material positioned in said plurality of trenches such that a desired height of said first, second and third fins is positioned above an upper surface of said layer of insulating material;
a recess defined in said second fin structure that at least partially defines a cavity in said layer of insulating material;
an SDB isolation structure positioned in said cavity on said recessed portion of said second fin, wherein said SDB isolation structure comprises:
an upper surface that is positioned at a level that is above a level of said upper surface of said layer of insulating material;
said upper surface of said SDB isolation structure is approximately level with an upper surface of said second fin positioned on opposite sides of said SDB isolation structure; and
a portion of said SDB isolation structure positioned above said upper surface of said recessed layer of insulating material has a substantially uniform width in a direction that corresponds to a width of said second fin; and
a gate structure for a transistor positioned above said SDB isolation structure.

10. The product of claim 9, wherein said SDB isolation structure and said layer of insulating material are both made of silicon dioxide.

11. The product of claim 9, wherein said first, second and third fins are arranged on a single fin pitch pattern.

* * * * *